United States Patent
Scaman

(10) Patent No.: US 6,781,141 B2
(45) Date of Patent: Aug. 24, 2004

(54) METHOD AND STRUCTURE FOR DETECTION AND MEASUREMENT OF ELECTRICAL AND MECHANICAL RESONANCE ASSOCIATED WITH AN E-BEAM LITHOGRAPHY TOOL

(75) Inventor: Michael Edward Scaman, Goshen, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/284,509

(22) Filed: Oct. 29, 2002

(65) Prior Publication Data

US 2004/0079895 A1 Apr. 29, 2004

(51) Int. Cl.[7] .......................... A61N 5/00; G01N 23/00; H01J 3/14; H01J 3/26
(52) U.S. Cl. .................. 250/492.3; 250/306; 250/310; 250/311; 250/396 R; 250/397; 250/398; 250/492.1; 250/492.3
(58) Field of Search ........................ 702/28; 324/318; 250/306, 310, 311, 396 R, 397, 398, 491.1, 492.1, 492.2, 492.3

(56) References Cited

U.S. PATENT DOCUMENTS

| | | | | |
|---|---|---|---|---|
| 5,650,616 A | * | 7/1997 | Iketaki ........................ 250/288 |
| 5,818,239 A | * | 10/1998 | Scaman ........................ 324/537 |
| 5,936,408 A | * | 8/1999 | Scaman ........................ 324/537 |
| 5,991,023 A | * | 11/1999 | Morawski et al. .......... 356/326 |
| 6,002,479 A | * | 12/1999 | Barwicz et al. ............. 356/326 |
| 6,005,966 A | * | 12/1999 | Scaman ........................ 382/149 |
| 6,242,923 B1 | * | 6/2001 | Scaman et al. ............. 324/529 |
| 6,307,500 B1 | * | 10/2001 | Cornman et al. ............. 342/26 |
| 6,541,770 B1 | * | 4/2003 | Veneklasen .................. 250/310 |
| 6,580,071 B2 | * | 6/2003 | Weinberger et al. ........ 250/287 |
| 6,584,413 B1 | * | 6/2003 | Keenan et al. ................ 702/28 |
| 6,675,106 B1 | * | 1/2004 | Keenan et al. ................ 702/28 |
| 6,690,168 B1 | * | 2/2004 | Herron ........................ 324/318 |

* cited by examiner

*Primary Examiner*—Nikita Wells
*Assistant Examiner*—Mary El-Shammaa
(74) *Attorney, Agent, or Firm*—Daryl K. Neff; Jay H. Anderson

(57) ABSTRACT

As disclosed herein, a system and method are provided for detection and measurement of noise on E beam tools and devices including a spectrum analyzer which looks at the different frequency components of the noise. The deflected electron beam from the tool is calibrated in a coarse and fine mode by scanning the beam over a grid-like calibration target. The position of where the bars are detected is compared to where they actually are, and the deflection can be calibrated so that it matches the grid. This invention can utilize a Fast Fourier Transform (FFT) of the time-ordered data which allows one to see peaks associated with noise.

8 Claims, 3 Drawing Sheets

METHOD AND STRUCTURE FOR DETECTION AND MEASUREMENT OF ELECTRICAL AND MECHANICAL RESONANCE ASSOCIATED WITH AN E-BEAM LITHOGRAPHY TOOL

FIELD OF THE INVENTION

This invention relates generally to making of masks for semiconductor use and more particularly to detection and eradication of noise and other electrical and mechanical resonance in an electron beam tool used in writing to a substrate.

BACKGROUND OF THE INVENTION

In today's fabrication of Integrated Circuits (IC) and other semiconductor devices, lithographic delineation procedures are used to yield positive or negative images to bring about selective processing, e.g. etching, implantation, diffusion, deposition, etc. This is especially true in fabrications of masks where the fabrication tool provides Blocking regions and Transparent regions which when illuminated by electron radiation yields an image defined by relatively low and high electron intensities, respectively. A Blocking region is usually defined as the mask region resulting in a degree of electron attenuation in the image which is of consequence in device fabrication. By contrast, a Transparent region is the mask region resulting in a degree of electron attenuation in the image which is small relative to blocking regions in terms of device fabrication.

In the semiconductor industry, there is a continuing trend toward an increased device density. To achieve this, there is a continued effort towards the scaling down of device dimensions on semiconductor wafers. As smaller feature sizes become the new requirements (i.e. decreased width and spacing of interconnecting lines, etc.), new ways have to be utilized to achieve their manufacturing. High resolution lithographic processes are used as one of these manufacturing techniques to yield small component features.

In general, lithography refers to processes for pattern transfer between various media. In lithography for integrated circuit fabrication, a silicon slice, the wafer, is coated uniformly with a radiation-sensitive film, the resist. The film is then selectively exposed to radiation, such as optical light, x-rays, or an electron beam, through an intervening master template or the mask, forming a particular pattern. (In a mask, this leads to the creation of Blocking and Transparent regions which when illuminated by electron radiation yields an image defined by relatively low and high electron intensities, respectively.)

Most often exposed areas of the coating become either more or less soluble than the unexposed areas (depending on the type of coating) in a particular solvent developer. The more soluble areas are removed with the developer in a developing step, the less soluble areas remain on the silicon wafer forming a patterned coating. The pattern corresponds to the image of the mask or its negative. The patterned resist is used in further processing of the silicon wafer.

At various stages in forming the patterned resist coating and processing the silicon wafer, it is desirable to measure critical dimensions resulting from the lithographic process. Critical dimensions can include the size of features in the wafer or patterned resist such as line widths, line spacing, and contact dimensions. Several calibration methods are developed and can be used such as scanning electron microscopy (SEM) systems.

In such calibration system, because of the super fine structures to be calibrated, an electron beam is often scanned across the sample. The beam interacts with the sample to produce measurable responses that vary with position over the course of a scan. Although all such calibration systems measure critical dimensions with high precision, they must be calibrated frequently for the measurements to be accurate. Precise measurements are reproducible, but contain systematic errors that must be quantified and taken into account for the measurements to be accurate. Calibration quantifies systematic errors and is carried out on a regular basis.

Calibration involves taking measurements on a calibration standard. A calibration standard is a sample having accurately known dimensions. One calibration standard commonly employed is a periodic pattern formed into a silicon substrate. Another type of calibration standard is formed with a patterned polysilicon coating over a silicon wafer. A thin layer of silicon oxide is used to facilitate binding between the patterned polysilicon and the wafer. A similar calibration standard is formed with a uniform polysilicon coating over the silicon oxide layer and has a calibration patterned formed in another silicon oxide coating that is formed over the polysilicon. Other calibration standards are also used and are available.

A number of problems, however, still exists in the fabrication of masks and calibration of such devices using (E beam) tools. One of the biggest problems is the presence of detractors such as mechanical and electrical sources of noise which impede the proper usage of the E beam tool. It would be important, therefore, to introduce a method and apparatus that can detect and quantify the noise during normal operation or as a diagnostic measure.

SUMMARY OF THE INVENTION

These and other objects are provided by the present invention for an apparatus and method for detection and measurement of noise on E beam tools and devices. A spectrum analyzer looks at the different frequency components of the noise. The deflected electron beam from the tool is calibrated in a coarse and fine mode by scanning the beam over a grid-like calibration target. The position of where the bars are detected is compared to where they actually are, and the deflection can be calibrated so that it matches the grid. This invention can utilize a Fast Fourier Transform (FFT) of the time-ordered data which allows one to see peaks associated with noise. The calibration sequence has to be performed to allow greater accuracy r for the electron beam tool in placement of patterns on a wafer or mask.

DETAILED DESCRIPTION OF THE PREFERRED EMBODIMENTS

As lithography demands increase, the need to writing to the substrate with a greater accuracy increases. As discussed, E beam writing tools may have a rough calibration for translation corrections across the writing field followed by a fine calibration which may correct translation and a number of other corrections such as magnification, rotation or trapezoidal effects. These are generally done at two rates and give two differing time scale opportunities to examine tool resonance as the tool is converging to its calibrated correction state as it calibrates a writable field.

The related application FIS8-2002-0209 generally suggests in one embodiment the taking of the subfield average of the raw error data in the field and in the order in time collected for course of fine calibration, padding the data to a boundary of a power of two and apply an FFT to get rid of some noise and resonance acting as a detractor.

The present invention, provides for a way to measure noise on E beams devices and tools by using a spectrum analyzer which looks at the different frequency components of the noise. This invention has a distinct advantage that is can be performed in-situ. The deflected beam is calibrated in a coarse and fine mode by scanning the beam over a grid-like calibration target. The position of where the bars are detected is compared to where they actually are, and the deflection can be calibrated so that it matches the grid. This invention takes a Fast Fourier Transform (FFT) of the time-ordered data which allows one to see peaks associated with noise. The calibration sequence has to be performed in order for the electron beam tool to place patterns accurately on a wafer or mask. This FFT can be performed off-line, and it does not require hooking up an external spectrum analyzer to the tool.

The first stage in the workings of the present invention is providing an example o of a spectrum analyzer. FIGS. 1–8 provide a variety of spectrums (taken at a slower and a faster) rate for analysis. The FFT (or inverse FFT when applicable) can then be performed on-line or off-line as provided earlier to chart the peaks.

Figure 1:
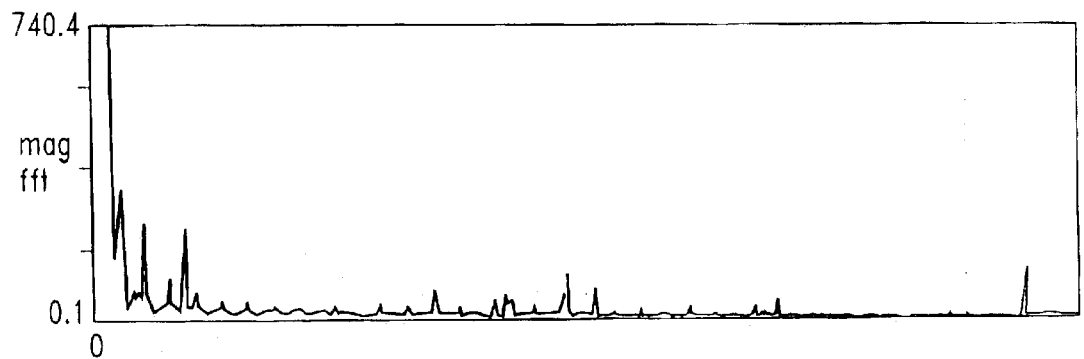
FIG. 1 is an illustration of an FFT example in the X axis with average feedback data/subfield for a fine calibration collect for the write cycle.
Figure 2:
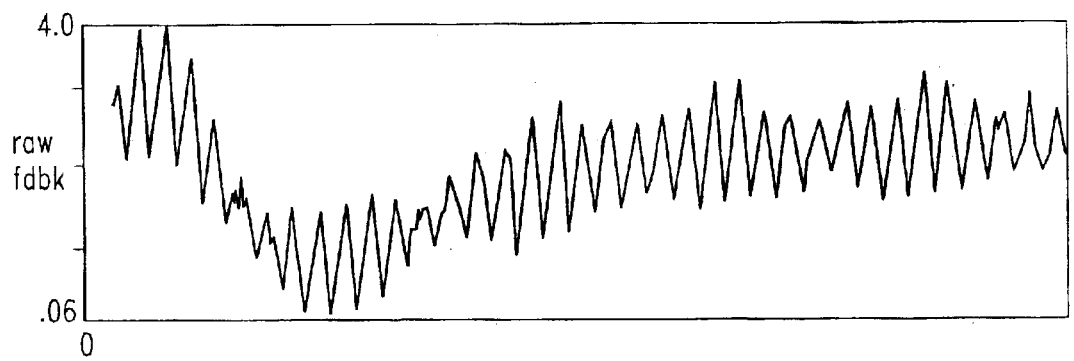
FIG. 2 is the raw time series data associated with FIG. 1.
Figure 3:
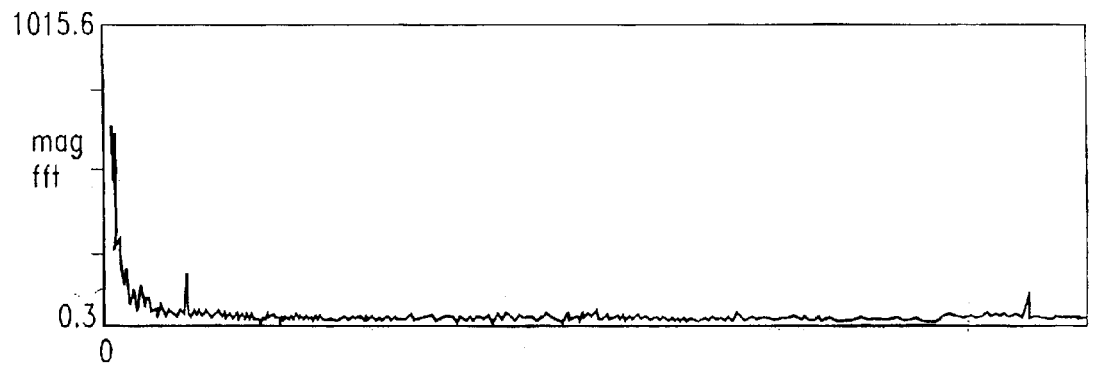
FIG. 3 is an illustration of an FFT example in the Y axis with average feedback data/subfield for a fine calibration collect for the write cycle.

FIGS. 1–8 provide examples of the working of the present invention. For an E beam tool, an FFT in the X axis (with average feedback data/subfield) is shown in FIG. 1 for a fine calibration collect for the write cycle and the raw time series data is also attached as shown in FIG. 2. A similar example for Y axis is shown in FIG. 3 and the associated raw time series data is also attached in FIG. 4.

As can be noted by looking at FIGS. 1 and 2, a number of low frequency resonance such as 10 hz, 60 hz, 2*60 hz and 2*60+10 hz form the FFT, but the time series graph is marginally helpful. (The resonance are cleaner, somewhat similar but somewhat different and actually some additional information shows up in the time series of some type of distortion.)

Figure 4:
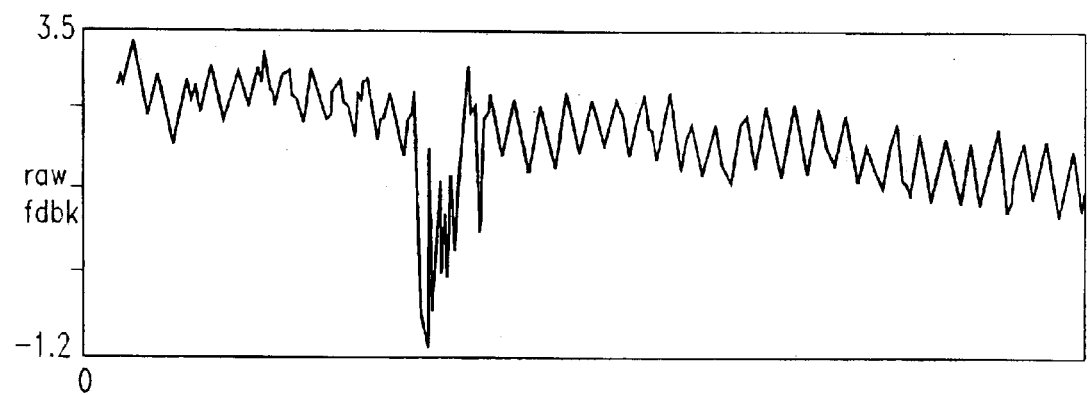
FIG. 4 is the raw time series data associated with FIG. 3.

In the case of a Y calibration, as FIGS. 3 and 4 indicate, the calibration is somewhat similar in the FFT but additional information is seen in the time series.

Figure 5:
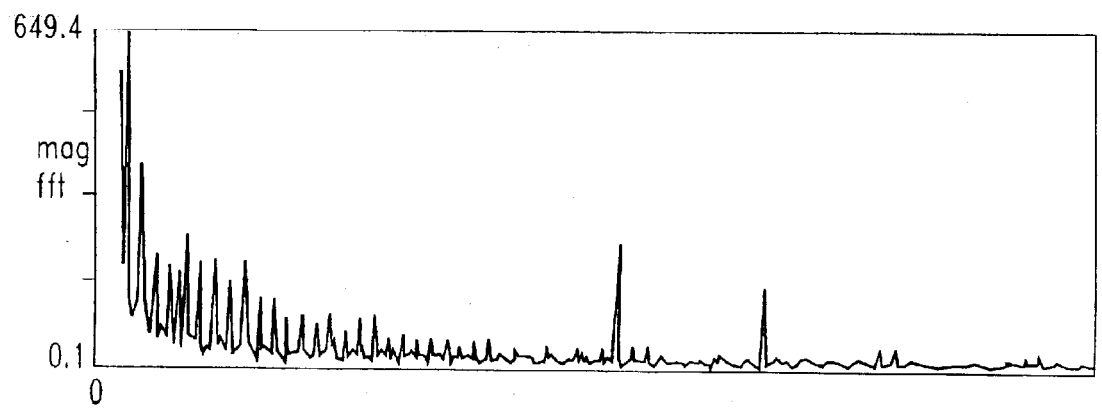
FIG. 5 is an illustration of an FFT example in the X axis with average feedback data/subfield for a coarse calibration collect for the write cycle.
Figure 6:
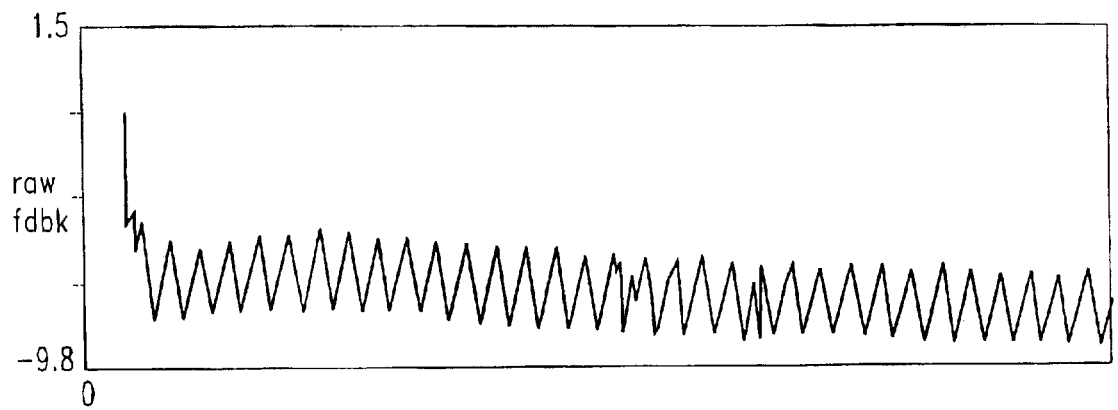
FIG. 6 is the raw time series data associated with FIG. 5.
Figure 7:
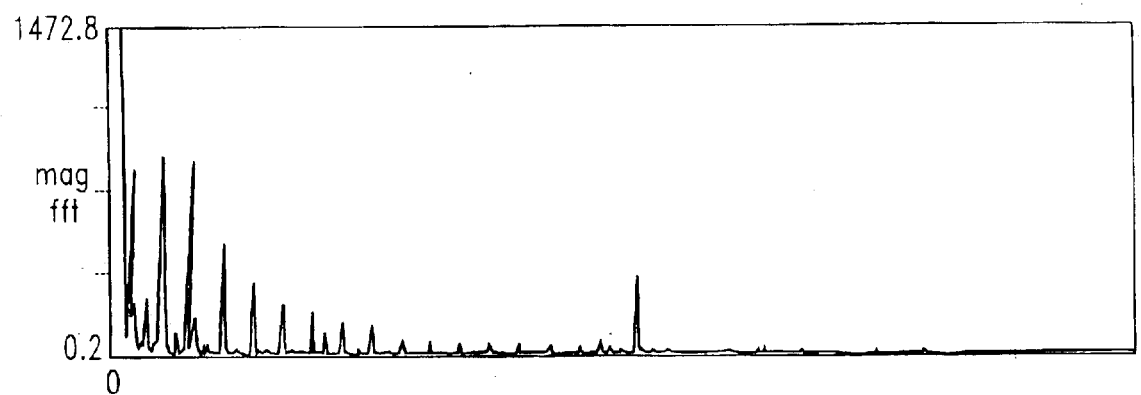
FIG. 7 is an illustration of an FFT example in the Y axis with average feedback data/subfield for a coarse calibration collect for the write cycle.
Figure 8:
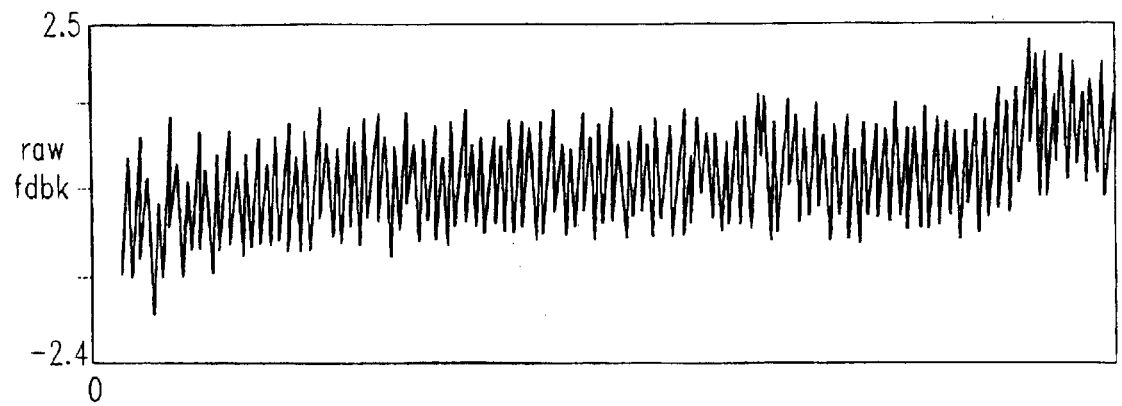
FIG. 8 is the raw time series data associated with FIG. 7.

If the coarse calibration is done slower, for example approximately 7.6 times slower for X, the graph results of FIGS. 5 and 6 are produced for X and the graphs results of FIGS. 7 and 8 are produced for Y.

Having the FFT in both X and Y and evaluating it for a faster versus a slower rate (collected during the normal course of tool calibration) allows the determination of a number of items, including the amount of resonance and its classification as being dependent or independent of time.

Reviewing the results provided in FIGS. 1–8, can give some measure of predictability of future results or detection and measurement of noise as would be provided by the analyzer. Note the following observations that can be made by analyzing/reviewing the results of FIGS. 1–8:

1) Some resonance stayed in the same position in the FFT regardless of whether the a fast or a slow collect procedure. The fast and slow FFT's all had an identical resonance at 1586 which would concludes that resonance in this case was not dependent on time, but it was dependent on target, stage or had some other systematic dependency on subfield numbers.

2) Some resonance between the fast and slow collect appeared to be compressed. This would make sense as the time scale of the FFT would be different.

3) The contribution of a peak or peaks could be related to standard deviation or variance since variance is closely related to the sum of squares of the measurements which in turn is related to the summation of the frequency measurements in the FFT divided by N or N squared depending on the form of the FFT.

Reviewing and analyzing the calibration data as provided above allows for allows recognition and quantification of a variety of noise detraction problems. One advantage of performing such analysis in this manner allows the procedure to remain a part of the normal periodic tool calibration which makes it is simple to implement and frequently usable (as opposed to interpretation of time waveform on an oscilloscope). Since the application can relate directly to tool performance, it can be workable within the framework of existing tool operations and applicable to many types of E beam tools. It also allow for a quick recognition of unusual tool behavior and can be used as a diagnostic tool, providing information which may lead to the problem resolution or in tool performance enhancements.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A method of detecting and measuring noise and resonance in an electron beam tool, comprising the steps of:

providing a spectrum analyzer with ability to look at different components of noise, said analyzer having a previously charted noise frequency grid position;

deflecting as least one electron beam;

calibrating said deflected electron beam at least in a fine and a coarse mode by scanning said beam over a grid-like calibration target;

storing position of said beam in each instance;

using said spectrum analyzer, analyzing the position of where the beam is each time it is detected in relation to where it is supposed to be according to the previously charted positions;

concluding presence of noise and its measurement according to result of said analysis performed by said spectrum analyzer; and providing a calibrating sequence for each beam present based on conclusions made in said concluding step and said analyzing step.

2. The method of claim 1, wherein said analyzer is connected to said electron beam tool.

3. The method of claim 2, wherein the result of the analysis performed by the spectrum analyzer comprises data, and further comprising the step of calculating a FFT of said data as to determine peaks associated with noise peak.

4. The method of claim 3, wherein said FFT is determined in a time-ordered fashion.

5. The method of claim 4, wherein said FFT is calculated by a computational device at a remote location.

6. The method of claim 5, wherein said calibration sequence is used in conjunction with said electron beam tool to place patterns accurately on a wafer of a substrate in a semiconductor environment.

7. The method of claim 5, wherein said calibration sequence is used in conjunction with said electron beam tool to place patterns accurately on a mask of a substrate in a semiconductor environment.

8. An apparatus for detection and measurement of noise and resonance in an electron beam tool, comprising:

a spectrum analyzer with ability to look at different components of noise, said analyzer having a previously charted noise frequency grid position;

at least one electron beam provided by the electron beam tool and deflected selectively;

a calibration component provided within said spectrum analyzer for analyzing said deflected electron beam at least in a fine and a coarse mode by scanning said beam over a grid-like calibration target and storing their position in each instance; and an analyzer component provided within said spectrum analyzer for analyzing the position of where the beam is each time it is detected in relation to where it is supposed to be according to the previously charted positions so that a calibrating sequence can be provided.

* * * * *